United States Patent
Wakimoto et al.

(10) Patent No.: US 7,350,019 B2
(45) Date of Patent: Mar. 25, 2008

(54) CONTENT ADDRESSABLE MEMORY DEVICE CAPABLE OF BEING USED IN CASCADED FASHION

(75) Inventors: Yoshinori Wakimoto, Mihama-ku (JP); Yoshihiro Ishida, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 274 days.

(21) Appl. No.: 10/790,058

(22) Filed: Mar. 2, 2004

(65) Prior Publication Data

US 2004/0236903 A1 Nov. 25, 2004

(30) Foreign Application Priority Data

Mar. 3, 2003 (JP) .............................. 2003-055553

(51) Int. Cl.
*G06F 12/00* (2006.01)

(52) U.S. Cl. ........................ 711/108; 711/205; 711/207; 365/49

(58) Field of Classification Search ................. 711/108, 711/205, 207; 365/49
See application file for complete search history.

(56) References Cited

U.S. PATENT DOCUMENTS

| | | | |
|---|---|---|---|
| 6,148,364 A | | 11/2000 | Srinivasan et al. |
| 6,175,513 B1 * | | 1/2001 | Khanna ........................ 365/49 |
| 6,240,485 B1 | | 5/2001 | Srinivasan et al. |
| 6,317,350 B1 | | 11/2001 | Pereira et al. |
| 6,374,326 B1 * | | 4/2002 | Kansal et al. ................ 711/108 |
| 6,393,514 B1 * | | 5/2002 | Khanna et al. ............. 711/108 |
| 6,480,931 B1 * | | 11/2002 | Buti et al. ................... 711/108 |
| 6,493,793 B1 * | | 12/2002 | Pereira et al. .............. 711/108 |
| 6,493,812 B1 * | | 12/2002 | Lyon .......................... 711/207 |
| 6,512,684 B2 * | | 1/2003 | Gordon et al. ................ 365/49 |
| 6,611,445 B2 * | | 8/2003 | Kanazawa et al. ............ 365/49 |
| 2002/0122337 A1 * | | 9/2002 | Kanazawa et al. ...... 365/189.12 |
| 2003/0110329 A1 * | | 6/2003 | Higaki et al. ................. 710/36 |

FOREIGN PATENT DOCUMENTS

JP 2001-236790 * 8/2001

OTHER PUBLICATIONS

Moors et al., "Cascading Content-Addressable Memories", Jun. 1992, IEEE Micro, vol. 12, Issue 3, pp. 56-66.*

* cited by examiner

*Primary Examiner*—Sanjiv Shah
*Assistant Examiner*—Arpan Savla
(74) *Attorney, Agent, or Firm*—Oliff & Berridge, PLC

(57) ABSTRACT

The configuration of a CAM device can be set in various manners depending on a system in which CAM having different configurations is needed. The CAM device includes a CAM array including a plurality of physical banks, a logical bank-physical bank converter for setting the assignment between logical banks and physical banks, and for outputting a control signal to set the configuration of a physical bank assigned to the logical bank, depending on a logical bank signal indicating a logical bank to be searched, a priority circuit for outputting search results in accordance with predetermined priority, and a cascade circuit for performing a logical operation on the search results output from the priority circuit of the present CAM device and a search results supplied from a higher-order CAM device, and transmitting the results of the logical operation to a lower-order CAM device.

6 Claims, 8 Drawing Sheets

FIG. 4

| | P BANK 0 | P BANK 1 | P BANK 2 | P BANK 3 | P BANK 4 | P BANK 5 | P BANK 6 | P BANK 7 | TABLE CONFIGU-RATION | TABLE OUTPUT | CONFIG <2:0> |
|---|---|---|---|---|---|---|---|---|---|---|---|
| L BANK 0 | 1 | 0 | 0 | 0 | 0 | 0 | 0 | 0 | 128 BIT TERNARY | 10100000 | 101 |
| L BANK 1 | 0 | 1 | 0 | 0 | 0 | 0 | 0 | 0 | 64 BIT BINARY | 01000000 | 000 |
| L BANK 2 | 0 | 1 | 0 | 0 | 1 | 0 | 0 | 0 | 128 BIT BINARY | 01001000 | 001 |
| L BANK 3 | 0 | 0 | 0 | 1 | 0 | 0 | 0 | 1 | 256 BIT BINARY | 00010001 | 010 |
| L BANK 4 | 0 | 0 | 0 | 0 | 0 | 1 | 1 | 0 | 256 BIT TERNARY | 00000110 | 110 |
| L BANK 5 | 0 | 0 | 0 | 0 | 0 | 0 | 0 | 0 | NOT USED | 00000000 | |
| L BANK 6 | 0 | 0 | 0 | 0 | 0 | 0 | 0 | 0 | NOT USED | 00000000 | |
| L BANK 7 | 0 | 0 | 0 | 0 | 0 | 0 | 0 | 0 | NOT USED | 00000000 | |

ASSIGN = "1"
NO ASSIGN = "0"

FIG. 5

|  | P BANK 0 | P BANK 1 | P BANK 2 | P BANK 3 | P BANK 4 | P BANK 5 | P BANK 6 | P BANK 7 |
|---|---|---|---|---|---|---|---|---|
| L BANK 0 | BIT <0> | BIT <1> | BIT <2> | BIT <3> | BIT <4> | BIT <5> | BIT <6> | BIT <7> |
| L BANK 1 | BIT <8> | BIT <9> | BIT <10> | BIT <11> | BIT <12> | BIT <13> | BIT <14> | BIT <15> |
| L BANK 2 | BIT <16> | BIT <17> | BIT <18> | BIT <19> | BIT <20> | BIT <21> | BIT <22> | BIT <23> |
| L BANK 3 | BIT <24> | BIT <25> | BIT <26> | BIT <27> | BIT <28> | BIT <29> | BIT <30> | BIT <31> |
| L BANK 4 | BIT <32> | BIT <33> | BIT <34> | BIT <35> | BIT <36> | BIT <37> | BIT <38> | BIT <39> |
| L BANK 5 | BIT <40> | BIT <41> | BIT <42> | BIT <43> | BIT <44> | BIT <45> | BIT <46> | BIT <47> |
| L BANK 6 | BIT <48> | BIT <49> | BIT <50> | BIT <51> | BIT <52> | BIT <53> | BIT <54> | BIT <55> |
| L BANK 7 | BIT <56> | BIT <57> | BIT <58> | BIT <59> | BIT <60> | BIT <61> | BIT <62> | BIT <63> |

CONTENT ADDRESSABLE MEMORY DEVICE CAPABLE OF BEING USED IN CASCADED FASHION

BACKGROUND OF THE INVENTION

1. Field of the Invention

The present invention relates to a technique of realizing various configurations of a CAM (Content Addressable Memory) by using a single CAM device or a plurality of CAM devices connected in a cascaded fashion.

2. Description of the Related Art

In network devices such as a switching device or a router, a CAM is widely used to achieve high operating speed and high performance.

In network devices, it is needed to deal with various data formats depending on OSI (Open System Interconnection) layers. For example, address information in layer 2 is expressed by binary data with a long bit length, and address information in layer 3 is expressed by ternary data with a short bit length. The binary data refers to data that can be in either "0" state or "1" state, and the ternary data refers to data that can be in one of states "0", "1", and "X" (don't care). In some cases, a combination of information in different layers is used. In this case, data has a longer bit length.

To achieve a network device used in the above-described manner, it is required to use a plurality of CAMs that are different in type (binary or ternary), bit length, and/or memory capacity, depending on data formats.

To achieve such a network device, the following techniques (1) to (3) are known.

(1) A plurality of CAM devices different in type, bit length, and/or memory capacity are used.

(2) A CAM device having a plurality of physical banks is used, and the memory configurations of the physical banks are statistically set in accordance with address information in a particular layer, as disclosed, for example, in Japanese Patent Application Publication No. 2001-236790.

(3) A plurality of data having different bit lengths are dealt with by a single CAM device or a single physical bank.

In the technique (3), for example, when 31-bit data and 62-bit data are dealt with together, a 64-bit word ternary CAM such as that shown in FIG. 8 is used.

When 31-bit data is stored in the CAM device, data is stored in both high-order 32-bit part and low-order 32-bit part of each 64-bit word. In this case, the most significant bit of each of the high-order 32-bit part and the low-order 32-bit part is used as a flag, and the remaining 31 bits are used as data bits. In this case, the flag is set to 1 to indicate that data is 31 bits in length.

In the case in which 62-bit data is stored in the CAM device, each data is divided into two pieces and respectively stored in a high-order 31-bit part and a low-order 31-bit part of one 64-bit word. In this case, 0 is stored in each flag to indicate that data is 62-bit data.

When 31-bit data is searched, searching is performed in two steps, in each of which a combination of 32-bit data consisting of 31-bit search data plus a flag bit of "1" and 32-bit X data is used. In the first step, high-order 32-bit part in the CAM is searched on the basis of 64-bit data consisting of high-order 32-bit part indicating the search data and low-order 32-bit part given as X data. In the second step, low-order 32-bit part in the CAM is searched on the basis of 64-bit data consisting of high-order 32-bit part given as X data and low-order 32-bit part given as the search data.

When 62-bit data is searched, 64-bit data consisting of 62-bit search data plus two flags both being in 0 state is used.

However, in the techniques (1) and (2), a high proportion of the storage capacity is not used depending on the configuration. In particular, when a high-capacity CAM is used, the existence of non-used portion results in a significant increase in cost. In the technique (2), only one physical bank is allowed to be assigned to only one logical bank. Besides, a technique of using a plurality of CAM devices in a cascaded fashion is not considered. In the technique (3), searching is performed in two steps and a higher-priority search result is selectively output, and thus the technique (3) needs a complicated circuit and a long processing time.

SUMMARY OF THE INVENTION

In view of the above, an object of the present invention is to provide a CAM device which can be easily controlled and whose configuration can be set in various manners depending on a system in which a plurality of CAM devices are used, without producing non-used portion which would result in an increase in cost.

To achieve the above object, the present invention provides a CAM device including a CAM array including a plurality of physical banks, a logical bank to physical bank converter for setting the assignment between logical banks and physical banks, and that outputs a signal to set the configuration of a physical bank assigned to the logical bank, depending on a logical bank signal indicating a logical bank to be searched, a priority circuit for outputting search results in accordance with predetermined priority, and a cascade circuit for performing a logical operation on the search results output from the priority circuit of the present CAM device and a search results supplied from a higher-order CAM device, and transmitting the results of the logical operation to a lower-order CAM device.

Preferably, the logical bank to physical bank converter is capable of assigning one physical bank to two or more different logical banks.

In the CAM device according to the present invention, preferably, when searching is performed, if the present CAM device includes no physical bank assigned to a logical bank to be searched, the logical bank to physical bank converter of the present CAM device outputs a signal to the cascade circuit to inform that there is no physical bank assigned to the logical bank, and in response to the signal, the cascade circuit outputs a signal indicating that the present CAM device includes no hit entry.

BRIEF DESCRIPTION OF THE DRAWINGS

FIG. 4 is a table showing the correspondence between logical bank configuration and physical banks and the correspondence between logical bank configuration and signal CONFIG <2:0>, according to an embodiment of the present invention;

FIG. 5 is a table showing the correspondence between the table shown in FIG. 4 and respective bits of signal IN <63:0>;

DESCRIPTION OF THE PREFERRED EMBODIMENTS

A CAM device according to the present invention is described in further detail below with reference to the accompanying drawings.

Figure 1:
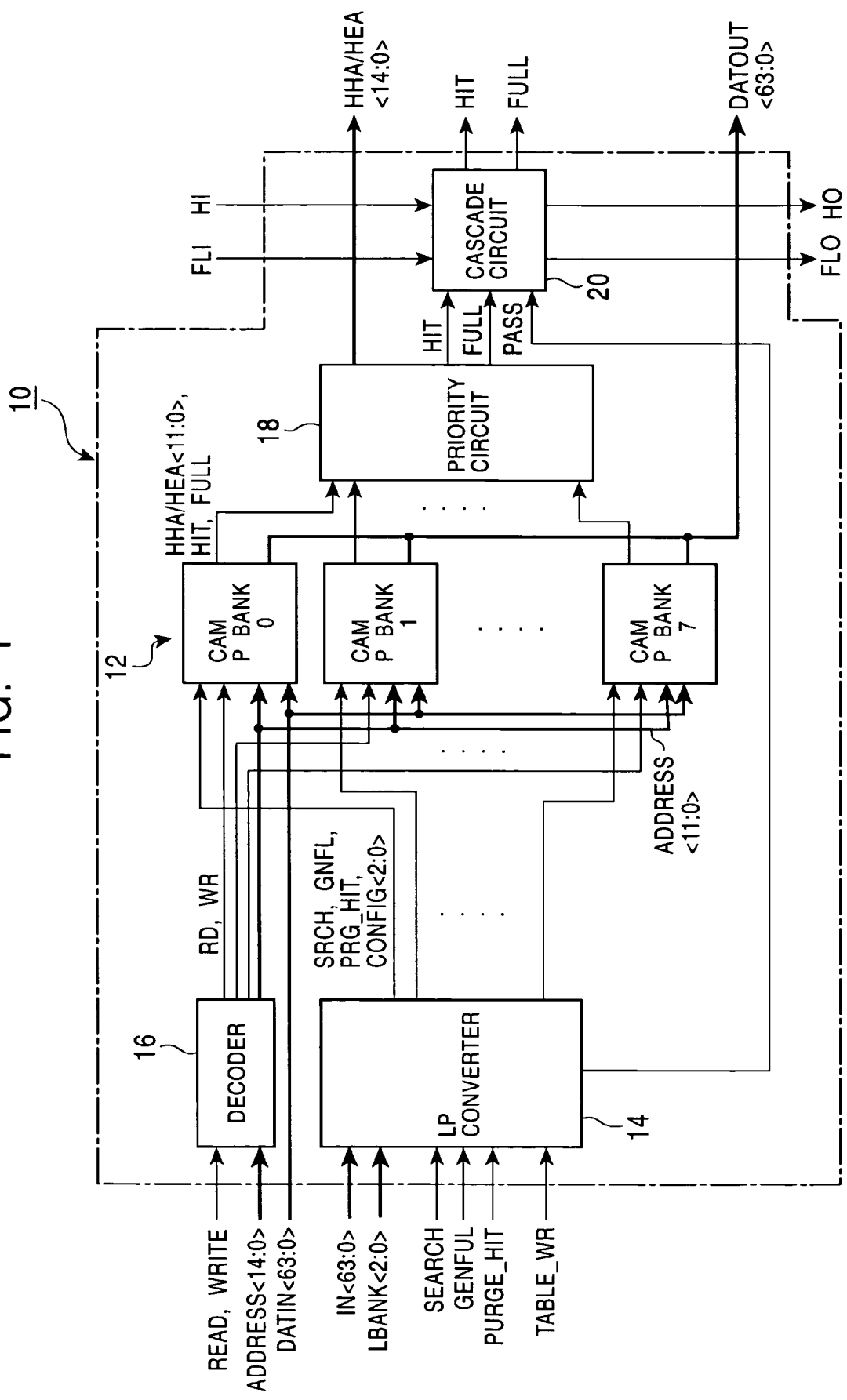
FIG. 1 is a block diagram of a CAM device according to an embodiment of the present invention.

FIG. 1 is a block diagram illustrating a CAM device according to an embodiment of the present invention. The configuration of the CAM device 10 shown in FIG. 1 can be changed. That is, it is possible to realize various configurations in terms of type (binary or ternary), bit length, and/or memory capacity, by using a single CAM device or a plurality of CAM devices connected in a cascaded fashion. The CAM device 10 includes a CAM array 12, a logical bank to physical bank converter 14 (hereinafter, referred to as a LP converter 14), a decoder 16, a priority circuit 18, and a cascade circuit 20.

As shown in FIG. 1, the CAM array 12 includes eight physical banks 0 to 7. The configuration of each physical bank can be set such that the CAM type (binary or ternary) and the bit length are set in accordance with signal CONFIG <2:0> output from the LP converter 14.

In FIG. 1, each physical bank is physically designed as a ternary CAM block with a storage capacity of 256 Kbits (64 bits×4 K words). The ternary CAM can also be used as a binary CAM by ignoring "X" (don't care) data. For example, when the physical bank is set so as to function as a 128-bit length binary memory block, searching is performed in two steps in each of which 64-bit data is searched. In this case, logical AND of search results obtained via the two steps is output as a final search result. Thus, the CAM apparently functions as a 128-bit length binary CAM.

In this case, the apparent number of words of the physical bank becomes 2 K words that is one-half the original number of words. When a CAM with a configuration of 128 bits×4 K words is needed, two physical banks are linked together and used as one logical bank. In the case in which the CAM is used as a 256-bit length CAM, searching is performed in four steps, and logical AND of search results obtained via the four steps is output as a final search result.

If the logical bank configuration is specified and assignment between the logical banks and the physical banks in the CAM array 12 is made, the LP converter 14 dynamically sets the configuration of each physical bank in accordance with the specified logical bank configuration, and the LP converter 14 controls respective physical banks such that a physical bank assigned to a logical bank to be searched is correctly accessed.

Herein, physical banks refer to physical memory blocks forming the CAM array 12. On the other hand, logical banks refer to memory blocks to which all memory space is logically divided depending on the structure of entry data. If necessary, two or more physical banks are linked together to form one logical bank having a required memory size. A signal indicating a logical bank to which entry data to be searched belongs is input from the outside of the CAM device. The concept of logical banks makes it possible to use the CAM device without concern for how the physical banks are actually configured.

In the CAM device 10, one physical bank can be assigned as a part of a plurality of logical banks. In a case in which the logical banks are different in configuration from each other, the configuration of the physical bank is dynamically changed in accordance with a signal CONFIG <2:0> supplied from the LP converter 14, each time a logical bank is selected. The configuration of each physical bank can be changed while preserving the data stored therein.

Figures 3A, 3B:
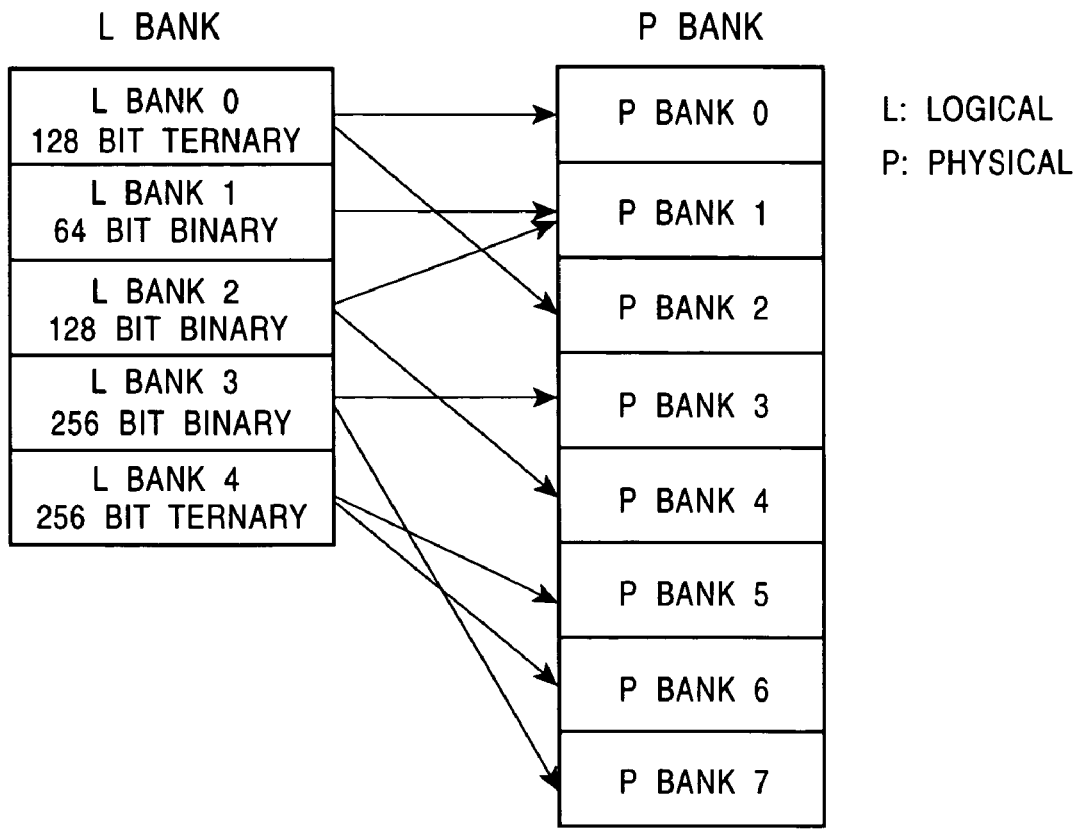
FIG. 3A is a conceptual diagram showing an example of the correspondence between logical banks and physical banks.
FIG. 3B is a table showing an example of the correspondence between logical bank configuration and signal CONFIG <2:0>, according to an embodiment of the present invention.

For example, as shown in FIG. 3A, when a logical bank 1 is set as a 64-bit binary bank, a logical bank 2 is set as a 128-bit binary bank, and both the logical banks 1 and 2 are linked with a physical bank 1, if the logical bank 1 is selected, the physical bank 1 is dynamically set to be a 64-bit binary bank in response to CONFIG <2:0>, while the physical bank 1 is dynamically set to be a 128-bit binary bank in response to CONFIG <2:0> if the logical bank 2 is selected.

A signal IN <63:0>, a signal LBANK <2:0>, a signal SEARCH, a signal GENFUL, a signal PURGE_HIT, and a signal TABLE_WR are input to the LP converter 14. The LP converter 14 supplies a signal SRCH, a signal GNFL, a signal PRG_HIT, and a signal CONFIG <2:0> individually to the respective physical banks 0 to 7 of the CAM array 12. The LP converter 14 also supplies a signal PASS to the cascade circuit 20. Those signals will be described in further detail later.

The decoder 16 controls writing of data into the CAM array 12 and reading of data from the CAM array 12.

Signals READ, WRITE and a signal ADDRESS <14:0> are input to the decoder 16. The decoder 16 supplies signals RD, WR separately to the respective physical banks and supplies a signal ADDRESS <11:0> in common to all physical banks 0 to 7.

To the respective physical banks 0 to 7, the signals SRCH, GNFL, PRG_HIT, and CONFIG <2:0> output from the LP converter 14 are separately input, and the signals RD, WR output from the decoder 16 are separately input, and the signal ADDRESS <11:0> and the signal DATIN <63:0> are commonly input. The physical banks 0 to 7 output signals DATOUT <63:0> which are wire-connected.

Signals HHA/HEA <11:0>, signals HIT, and signals FULL output from the respective physical banks are input to the priority circuit 18. The priority circuit 18 outputs a signal HHA/HEA <14:0>, a signal HIT, and a signal FULL.

Figure 6:
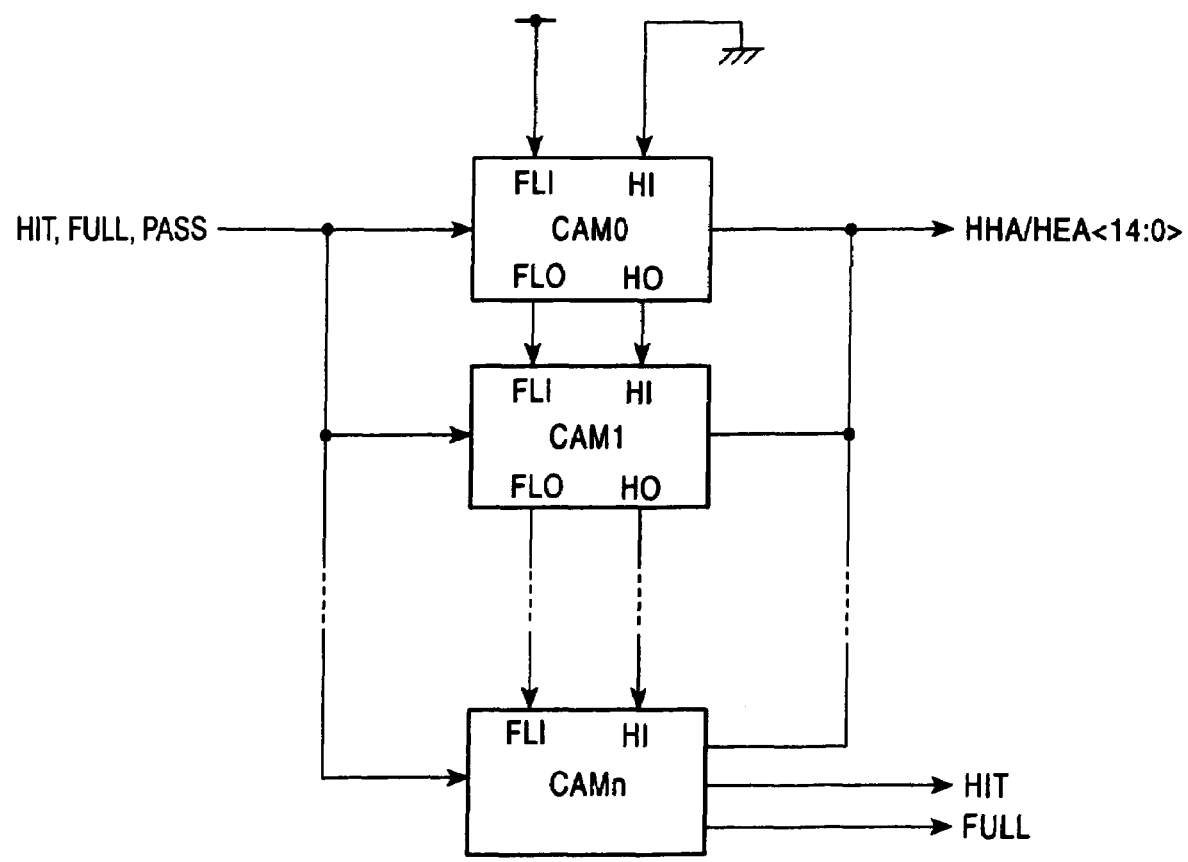
FIG. 6 is a block diagram showing a plurality of CAM devices connected in a cascaded fashion, according to an embodiment of the present invention.

When a plurality of CAM devices are used in a cascade-connected fashion, a signal HIT and a signal FULL are transmitted via the CAM devices from one CAM device to another in a direction from the highest-order CAM device to the lowest-order CAM device, under the control of the cascade circuit 20, as shown in FIG. 6.

To the cascade circuit 20, in addition to the signal HIT and the signal FULL supplied from the priority circuit 18 and the signal PASS supplied from the LP converter 14, a signal HI (Hit Input) and a signal FLI (Full Input) output from a higher-order CAM device are input. The cascade circuit 20 supplies a signal HO (Hit Output) and a signal FLO (Full Output) to a lower-order CAM device. The cascade circuit 20 also outputs a signal HIT and a signal FULL.

The physical banks of the CAM device according to the present invention are described in further detail below.

Figure 2:
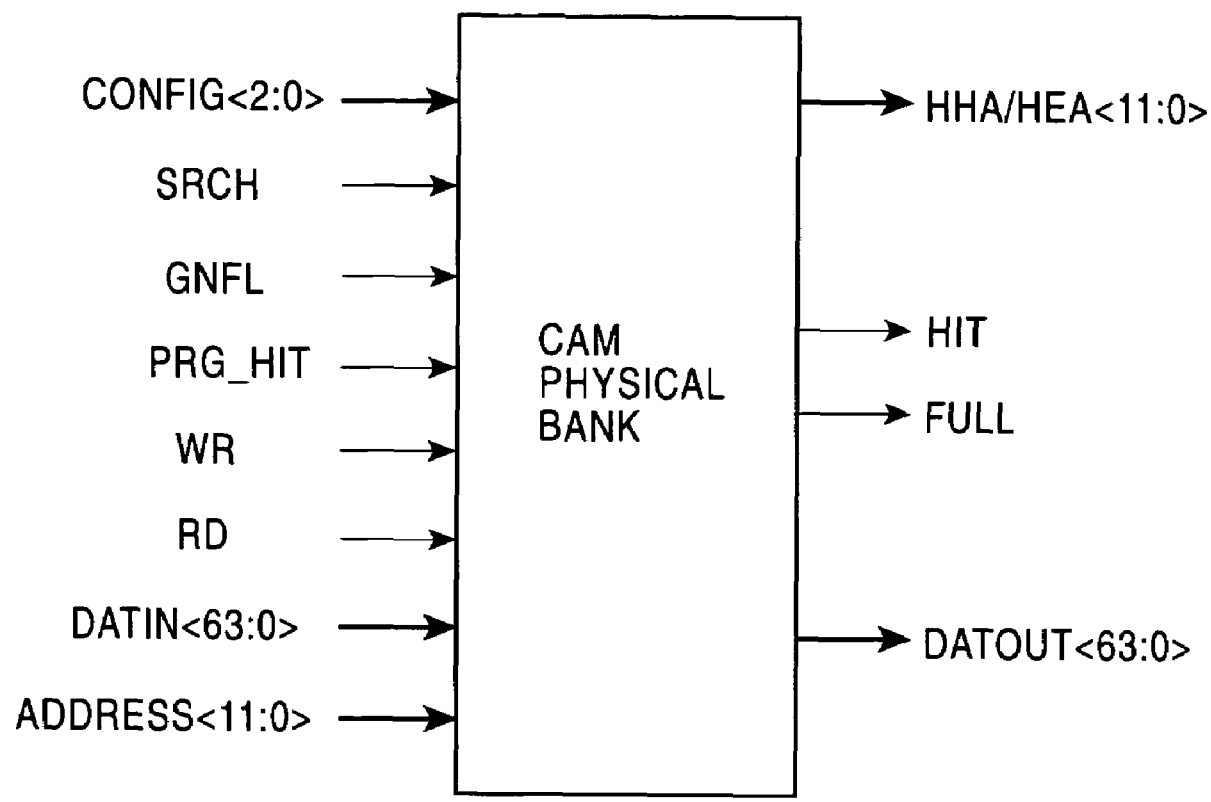
FIG. 2 is a conceptual diagram showing a physical bank according to an embodiment of the present invention.

FIG. 2 is a conceptual diagram showing a physical bank according to an embodiment of the present invention. In FIG. 2, one of the plurality of physical banks shown in FIG. 1 is shown.

The configuration of the physical bank is set in accordance with a signal CONFIG <2:0>. In the present embodiment, the configuration in terms of type (binary or ternary) and bit length (64 bits, 128 bits, or 256 bits), is specified by 3-bit CONFIG <2:0> as shown, in the form of a table, in FIG. 4. Note that 3-bit data can specify one of a total of eight different configurations.

Data ADDRESS <11:0> is address data specifying a word address in the physical bank.

Data DATIN <63:0> is entry data that is input to the physical bank and stored therein, or search data.

Data DATOUT <63:0> is entry data read from the physical bank.

A signal WR is an input signal in response to which 64-bit data DAIN <63:0> input to the physical bank is written at a word address specified by ADDRESS <11:0>.

A signal RD is an input signal in response to which entry data stored at a word address specified by ADDRESS <11:0> is read out as DATOUT <63:0>.

A signal SRCH is an input signal in response to which searching in the physical bank is started.

A signal HIT is an output signal indicating whether the present physical bank includes a hit entry, that is, an entry that matches a search data. In the present embodiment, if when entries stored in the present physical bank include at least one or more hit entries, HIT becomes high in level, but HIT becomes low in level if there is no hit entry.

HHA <11:0> is output data indicating a highest-priority hit address. If one or more hit entries are found as a result of searching, a hit address at which highest-priority hit entry is stored is output as HHA <11:0>.

PRG_HIT is an input signal in response to which a hit entry found in the physical bank as a result of searching is deleted. If a highest-priority hit entry is deleted in response to PRG_HIT, a next highest-priory hit entry becomes a highest-priority hit entry. This makes it possible to sequentially output hit entries, when a plurality of hit entries are found.

GNFL is an input signal in response to which a highest-priority empty address in the physical bank is searched. If GNFL is input, HEA <11:0> is output.

FULL is an output signal to indicate whether the physical bank includes at least one empty data that is an invalid entry data, in response to GNFL input to the physical bank. In the present embodiment, when there is no empty entry (that is, when the physical bank is full), FULL becomes high. On the other hand, FULL becomes low when there is one or more empty entries.

HEA <11:0> is output data indicating a highest-priority empty address. When GNFL is input, if FULL becomes low to indicate that the physical bank includes one or more empty entries, HEA <11:0> is output to indicate a memory address at which a highest-priority empty entry is stored.

If the signals SEARCH, GENFUL, and PURGE_HIT are input to the LP converter 14, logical AND between those signals and the outputs from the logical-physical conversion table shown in FIG. 6, and the results of the logical AND are output as signals SRCH, GNGL, and PRG_HIT, which are supplied only to particular physical banks that are assigned to a logical bank specified by the signal LBANK <2:0> and that are assigned "1" in the logical-physical conversion table.

The operation of the CAM device 10 is described in further detail below with reference to FIGS. 3 to 5, for a case in which up to eight logical banks can be set.

FIG. 3A shows the correspondence between logical banks and physical banks according to an embodiment of the present invention. In this specific example shown in FIG. 3A, five logical banks 0 to 4 are set. The logical bank 0 is set to function as a 128-bit length ternary bank. The logical bank 1 is set to function as a 64-bit length binary bank, the logical bank 2 is set to function as a 128-bit length binary bank, the logical bank 3 is set to function as a 256-bit length binary bank, and the logical bank 4 is set to function as a 256-bit length ternary bank.

As described above, the configuration of each physical bank is dynamically set depending on a selected logical bank in response to the signal CONFIG <2:0> output from the LP converter 14. In the present embodiment, the signal CONFIG <2:0> is defined by eight registers (each including 3 bits, although not shown in the figures) which correspond to the respective logical banks 0 to 7 and which are disposed in the LP converter 14. The contents of those registers are set from the outside of the CAM device 10 in response to a signal TABLE_WR.

In the specific example shown in FIG. 3A, a ternary CAM with a configuration of 128 bits×4 K words obtained by linking the physical banks 0 and 2 is assigned to the logical bank 0, the physical bank 1 functioning as a binary CAM with a configuration of 64 bits×4 K words is assigned to the logical bank 1, a binary CAM with a configuration of 128 bits×4 K words obtained by linking the physical banks 1 and 4 is assigned to the logical bank 2, a binary CAM with a configuration of 256 bits×2 K words obtained by linking the physical banks 3 and 7 is assigned to the logical bank 3, and a ternary CAM with a configuration of 256 bits×2 K words obtained by linking the physical banks 5 and 6 is assigned to the logical bank 4.

FIG. 4 shows, in the form of a table, the correspondence between the logical banks and the physical banks shown in FIG. 3A. A logical bank is specified by the signal LBANK <2:0> input to the LP converter 14. The correspondence between the logical banks and the physical banks is defined in a LP conversion table stored in the LP converter 14. In the LP conversion table, "Assigned" and "Not Assigned" are respectively represented by "1" and "0".

The LP conversion table is written in accordance with values input by the signal IN <63:0>. Depending on the required configuration of the CAM, the configurations of the respective logical banks are determined. When a logical bank is specified by the signal LBANK <2:0>, the configuration of physical banks corresponding to the specified logical bank is dynamically changed in accordance with the signal CONFIG <2:0>.

In the CAM device 10, before searching is performed, entry data are written into physical banks corresponding to the respective logical banks. Writing of each entry data is performed by writing the signal DATIN <63:0> at a word address specified by the signal ADDRESS <14:0>, that is, the signal DATIN <63:0> is written at the corresponding address in the physical banks corresponding to the logical bank.

For example, in a case in which searching is performed in a 128-bit length binary CAM assigned to the logical bank 2, the signal LBANK <2:0>="010" (in binary) specifying the logical bank 2 is input. In the LP conversion table shown in FIG. 4, in a row corresponding to the logical bank 2 specified by the signal LBANK <2:0>="010", 01001000" is described to indicate that the physical banks 1 and 4 are assigned. Thus, for the logical bank 2, the signal CONFIG <2:0>="001" is output to the physical banks 1 and 4 so as to form a 128-bit length binary CAM.

Thereafter, if DATIN <63:0> is input as search data, and if the control signal SEARCH indicating that searching should be started is input, the signal SRCH is supplied from the LP converter 14 only to the physical banks 1 and 4, and searching is started only in those physical banks 1 and 4. Because the logical bank 2 is a 128-bit length binary CAM, searching is performed in two steps, and logical AND of search results obtained via the two steps is output as a final search result.

If, in the searching, entry data that matches the given search data with a total of 128 bit length is found in entry data stored in the physical banks 1 and 4, that is, if a hit entry is found, the signal HIT becomes high in level, and a signal HHA <11:0> indicating a hit address at which the hit entry is stored is output from the corresponding physical banks 1 and 4. The signal HIT and the signal HHA <11:0> are input to the priority circuit 18. In the case in which no hit entry is found in the physical banks 1 and 4 in the searching, the signal HIT output therefrom becomes low in level. Note that the signal HIT output from any of the physical banks 0, 2, 3, and 5 to 7, to which the signal SRCH is not supplied, is low in level.

The priority circuit 18 determines the priority in accordance with the signal HIT received from each physical bank, and the priority circuit 18 adds 3-bit data indicating the physical bank number of the highest-priority physical bank at the head of the signal HHA <11:0> indicating the highest-priority hit address. The resultant data is output as HHA <14:0> from the priority circuit 18. For example, if, of physical banks outputting a high-level signal HIT, a physical bank 5 has the highest priority, then 3-bit data "101" is added. Simultaneously with HHA <14:0>, the priority circuit 18 also output a signal HIT.

In the present embodiment, a physical bank having a smaller physical bank number has higher priority. Therefore, for example, if the physical bank 1 includes a hit entry, the priority circuit 18 adds HHA <14:12>="001" indicating the physical bank 1 to the signal HHA <11:0> output from the physical bank 1 and outputs the resultant data, regardless of the status of the physical bank 4. Note that the signal level of HIT output from the priority circuit 18 is determined so as to be equal to logical OR of signals HIT output from the physical banks 0 to 7 such that the signal HIT output from the priority circuit 18 becomes high in level when any one of the physical banks 0 to 7 includes a hit entry.

On the other hand, in searching for an empty address, if a logical bank 2 is specified, then the signal GNFL is supplied from the LP converter 14 only to the physical banks 1 and 4 corresponding to the logical bank 2. More specifically, when empty address searching is started in response to the signal GENFULL, the signal GNFL is supplied only to the physical banks 1 and 4 as described above, and empty address searching is started in the physical banks 1 and 4.

As a result of searching, the signal FULL output from any physical bank having an empty address becomes low in level, and a signal HEA <11:0> indicating an empty address is output from that physical bank. Note that the signal FULL output from physical banks determined to have no empty address in the searching is high in level, and also the signal FULL output from physical banks 0, 2, 3, and 5 to 7, to which the signal GNFL is not supplied, are high in level.

The priority circuit 18 determines the priority for empty addresses in accordance with the signal FULL received from each physical bank, and adds 3-bit data indicating the physical bank number of the highest-priority physical bank at the head of the signal HEA <11:0>. The resultant data is output as HEA <14:0> from the priority circuit 18. Simultaneously with HEA <14:0>, the priority circuit 18 also output the signal FULL. Note that the signal level of FULL output from the priority circuit 18 is determined so as to be equal to logical AND of signals FULL output from the physical banks 0 to 7 such that the signal FULL output from the priority circuit 18 becomes low in level when any one of the physical banks 0 to 7 includes an empty address.

In the CAM device 10, as described above, the high-capacity CAM array 12 including the plurality of physical banks is divided into a plurality of blocks, and the physical blocks are reconfigured so as to realize logical banks depending on the required CAM configuration. Thus, it is possible to configure the same single CAM device in different manners as required. This allows a great reduction in cost.

Because the configuration the CAM device 10 can be changed by assigning a particular physical bank to a particular logical bank, each time searching is performed, the conventional technique (3) can be realized without needing an additional external circuit and without causing an increase in processing time. This makes it possible to store data having a data size smaller than the storage capacity of one physical bank together with other data in the same physical bank, and thus it becomes possible to use the CAM in an efficient manner.

Furthermore, in the CAM 10, various configurations can be achieved by using logical banks. Use of logical banks makes it possible to easily control the CAM 10 from the outside even when it is configured in any possible form. Furthermore, searching is performed only in physical banks corresponding to a logical bank to be searched, and thus a reduction in power consumption is achieved.

A plurality of CAM devices can be cascaded as described below.

FIG. 6 shows an example in which (n+1) CAM devices each similar to the CAM device shown in FIG. 1 are cascaded. In FIG. 6, CAM0 is a highest-order CAM device, and CAMn is a lowest-order CAM device. In the case in which a plurality of CAM devices are used in a cascaded fashion, signals corresponding to HIT and FULL are sequentially transmitted through the plurality of CAM devices in a direction from the highest-order CAM device to the lowest-order CAM device.

The HI terminal of the highest-order CAM device, CAM0, is fixed to the low level, and its FLI terminal is fixed to the high level. The low-level signal HI indicates that there is no hit entry, and thus high-level signal FLI indicates that there is no empty entry.

Signals output from a HO terminal and an FLO terminal of the highest-order device CAM 0, that is, signals HO and FLO output from the cascade circuit 20 of the device CAM0, are respectively input to an HI terminal and an FLI terminals of a device CAM1 at the following stage. Similarly, signals output from a HO terminal and an FLO terminal of a CAM device at a previous stage are respectively input to a HI terminal and an FLI terminal of a CAM device at the following stage.

Although not shown in FIG. 6, various signals input to the CAM device 10 shown in FIG. 1 are commonly input to the respective CAM devices. Signals HHA/HEA <14:0> are output from the respective CAM devices and wire-connected. A signal HIT and a signal FULL are output from the lowest-order device CAMn. The signal HIT and the signal FULL output from the lowest-order device CAMn indicate a final search result.

In the present embodiment, the signal HIT output from each CAM device becomes high in level when that CAM device includes at least one hit entry, and the signal HIT becomes low in level only when the CAM device includes no hit entry. The cascade circuit 20 of each CAM device determines the logical OR of the signal HIT indicating the search result in the present CAM device and the signal HIT output from the CAM device at the previous stage, that is, the signal output from the terminal HO of the cascade circuit 20 of the CAM device at the previous stage, and the cascade circuit 20 of the present CAM device outputs a signal indicating the result of the logical OR from the terminal HO.

Thus, when there is a hit entry in at least one of devices CAM0 to CAMn, the signal HIT output from the lowest-order device CAMn becomes high in level. The signal HIT output from the lowest-order device CAMn becomes low in level only when any of devices CAM0 to CAMn includes no hit entry.

On the other hand, as for the signal HHA/HEA <14:0>, a signal HHA <14:0> from the highest-priority CAM device including a hit entry is output.

The signal FULL output from each CAM device becomes low in level when the CAM device includes at least one empty entry but becomes high in level if the CAM device includes no empty entry. The cascade circuit 20 of each CAM device determines the logical AND of the signal FULL indicating the search result in the present CAM device and the signal output from the terminal FLO of the cascade circuit 20 of the CAM device at the previous stage, and the cascade circuit 20 of the present CAM device outputs the result of the logical AND from the terminal FLO.

Thus, when at least one of devices CAM0 to CAMn includes an empty entry, the signal FULL output from the lowest-order device CAMn becomes low in level. On the other hand, when any of devices CAM0 to CAMn include no empty entry, the signal FULL output from the lowest-order device CAMn becomes high in level.

As for the signal HHA/HEA <14:0>, the signal HEA <14:0> from the highest-priority CAM device including an empty entry is output.

If the plurality of CAM devices cascaded as shown in FIG. 6 are viewed from the outside, those CAM devices as a whole can be regarded as a single CAM device having a high memory capacity.

When a plurality of CAM devices are used in a cascaded fashion, which one of CAM devices is to be accessed may be specified by a control signal that is decoded in the outside of the CAM devices and applied to the CAM devices, or alternatively, the control signal may be decoded internally and interpreted by each CAM device whether the CAM device is accessed or not.

The address is expanded by adding bits <17:15> indicating the CAM device number at the head of HHA/HEA. The bits <17:15> to be added may be determined by an external circuit depending on which device has output a valid result, or alternatively, the bits <17:15> may be produced internally in the CAM devices.

The operation is described below with reference to FIG. 7 for a case in which up to eight logical banks can be set in the cascaded CAM devices.

Figure 7:
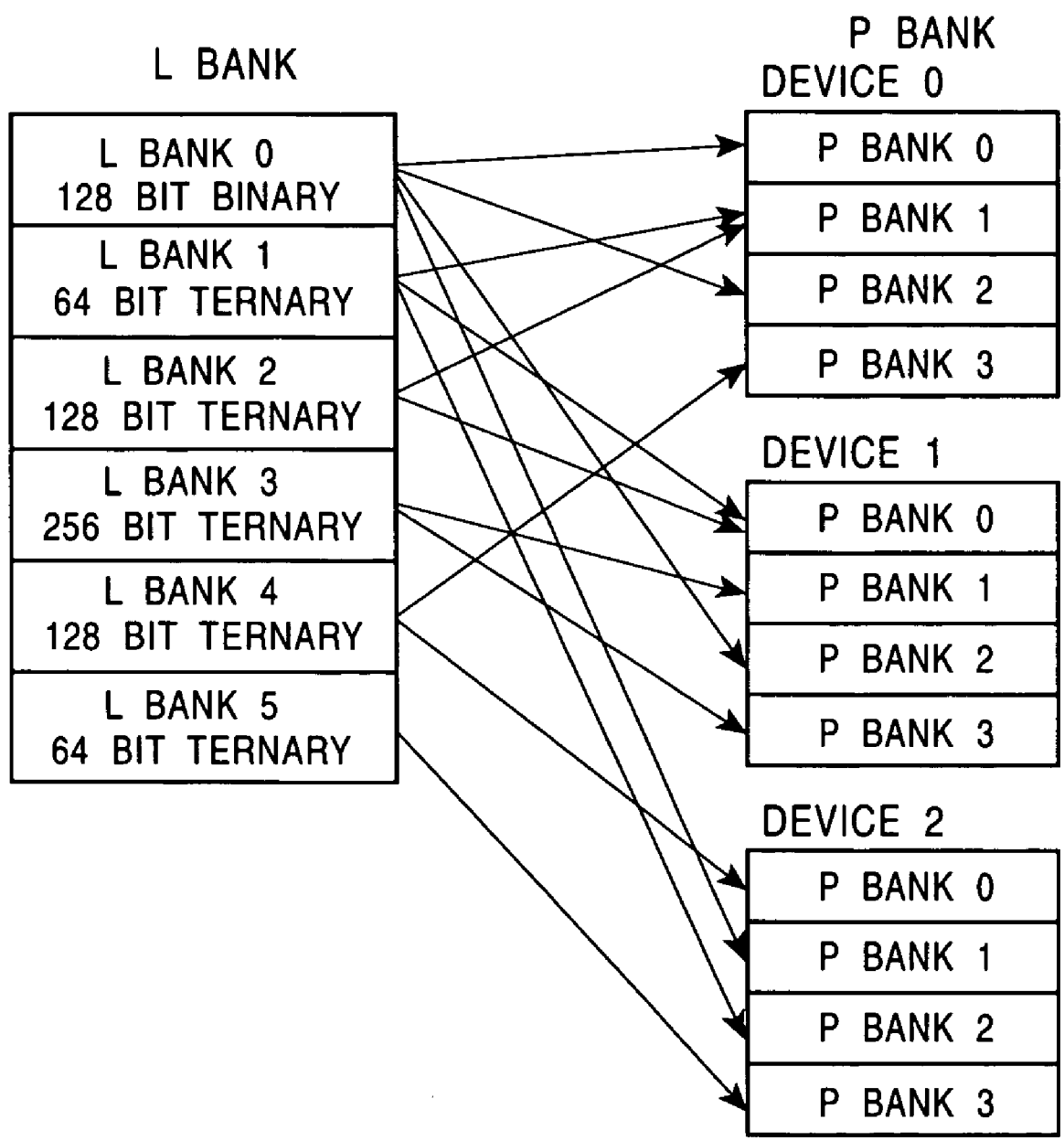
FIG. 7 is a diagram showing an example of the correspondence between logical banks and physical banks of cascaded CAM devices, according to an embodiment of the present invention.
Figure 8:
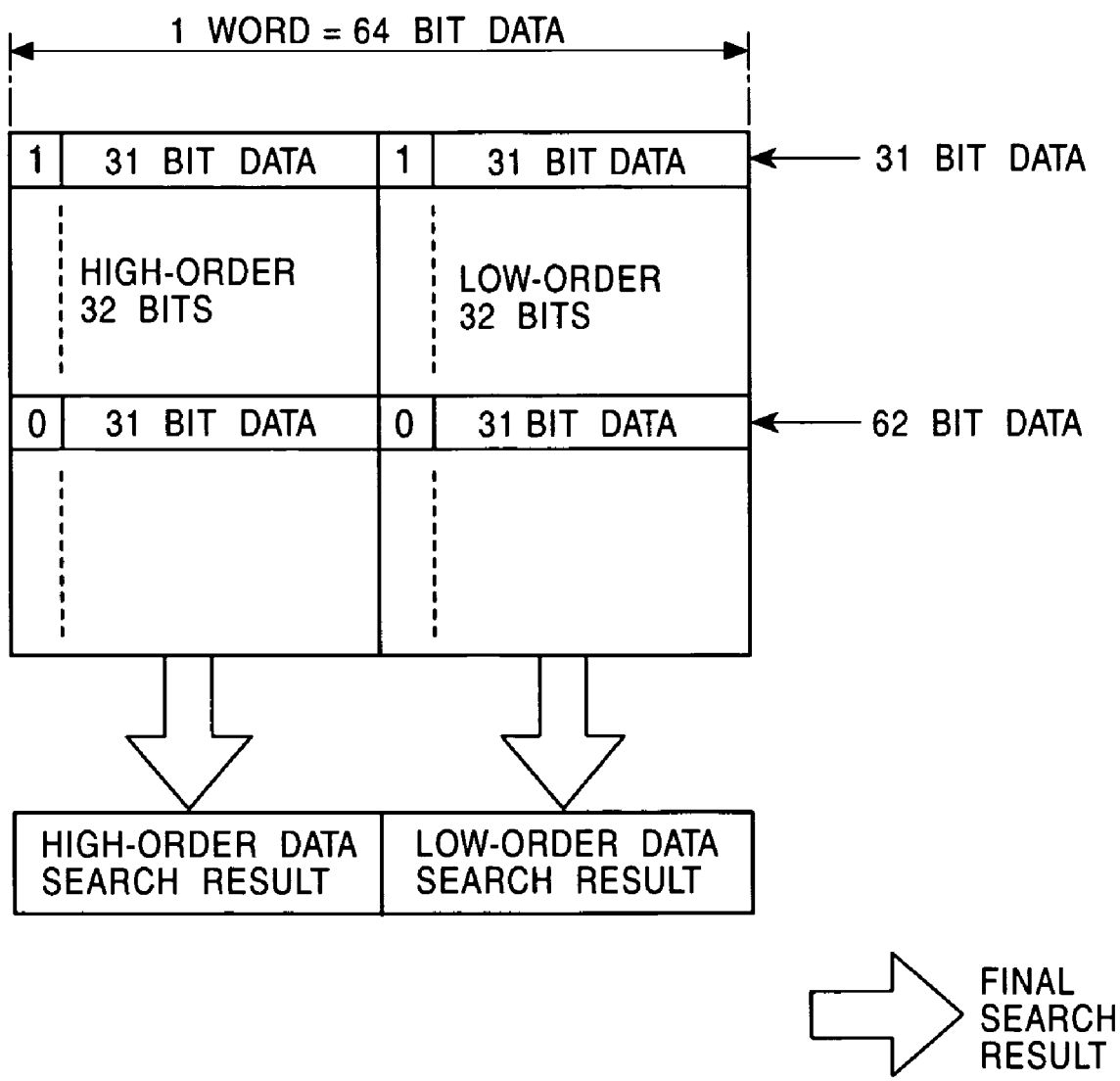
FIG. 8 is a diagram showing an example of a conventional CAM.

FIG. 7 is a conceptual diagram showing an example of the correspondence between logical banks and physical banks. In this specific example shown in FIG. 7, six logical banks 0 to 5 are set. The logical bank 0 is set to be in a 128-bit length binary configuration, the logical bank 1 is set to be in a 64-bit length ternary configuration, the logical bank 2 is set to be in a 128-bit length ternary configuration, the logical bank 3 is set to be in a 256-bit length ternary configuration, the logical bank 4 is set to be in a 128-bit length ternary configuration, and the logical bank 5 is set to be an in 64-bit length ternary configuration.

A binary CAM with a configuration of 128 bits×8 K words obtained by linking together the physical banks 0 and 2 of the device 0, the physical bank 2 of the device 1, and the Physical bank 1 of the device 2, is assigned to the logical bank 0. A ternary CAM with a configuration of 64 bits×12 K words obtained by linking together the physical bank 1 of the device 0, the physical bank 0 of the device 1, and the physical bank 2 of the device 2 is assigned to the logical bank 1. A ternary CAM with a configuration of 128 bits×4 K words obtained by linking together the physical bank 1 of the device 0 and the physical bank 0 of the device 1 is assigned to the logical bank 2. A ternary CAM with a configuration of 256 bits×2 K words obtained by linking together the physical banks 1 and 3 of the device 1 is assigned to the logical bank 3. A ternary CAM with a configuration of 128 bits×4 K words obtained by linking together the physical bank 3 of the device 0 and the physical bank 0 of the device 2 is assigned to the logical bank 4. And the physical bank 3 of the device 2 is assigned to the logical bank 5 functioning as a ternary CAM with a configuration of 64 bits×4 K words In this case, in the LP conversion table stored in the LP converter 14 of each of devices 0 to 2, information indicating the correspondence between the logical banks 0 to 7 and physical banks of each of devices 0 to 2 is stored in the LP conversion table stored in the LP converter 14 of that device.

For example, information is stored in the LP conversion table of the device 0 to indicate that the logical bank 0 is linked to the physical banks 0 and 2, the logical bank 1 is linked to the physical bank 1, the logical bank 2 is linked to the physical bank 1, the logical bank 3 is linked to no physical bank, the logical bank 4 is linked to the physical bank 3, the logical bank 5 is linked to no physical bank, and the logical banks 6 and 7 are linked to no physical bank. Information indicating correspondence is also stored in the devices 1 and 2.

Searching operation is performed in a similar manner in the manner in which searching is performed in the single CAM device 10. That is, if a particular logical bank is specified, then, in each device 0 to n, signals CONFIG <2:0> are supplied to respective physical banks linked to the specified logical bank, and the configurations of respective physical banks are dynamically set according to the signal CONFIG <2:0>. Searching is performed only in physical banks linked to the specified logical bank.

In the searching operation, a signal HIT and a signal FULL are transmitted through the CAM devices in a direction from the highest-order CAM device to the lowest-order CAM device. As described above, in a device including a physical bank linked to a logical bank in which searching is to be performed, the cascade circuit 20 thereof performs logical operations with respect to signals HIT and FULL between those indicating the search result in the present device and those output from a higher-order device, and the cascade circuit 20 transmits the signals obtained as results of the logical operations to a lower-order device. The signals HIT and FULL are transmitted from one device to another in a similar manner.

When a plurality of CAM devices are used in the cascaded fashion, there is a possibility that a certain device includes a physical bank linked to a logical bank in which searching is to be performed but another device does not include such a physical bank. For example, in an example shown in FIG. 7, the logical bank 3 is linked only to the physical banks 1 and 3 of the device 1, and is not linked to any physical bank in the devices 0 and 2. In this case, although searching is performed in the device 1 including physical banks linked to the logical bank 3, searching is not performed in the devices 0 and 2 including no physical bank linked to the logical bank 3.

To make it possible to correctly perform searching even in such a situation, the LP converter 14 outputs a signal PASS in accordance with the LP conversion table to indicate whether the present CAM device includes a physical bank linked to an input logical bank signal.

If the cascade circuit 20 of each device determines, from the signal PASS supplied from the LP converter 14, that the device does not include any physical bank linked to the logical bank of interest, the cascade circuit 20 outputs a signal HIT indicating that there is no hit entry or a signal FULL indicating that there is no empty entry as a signal indicating the result of searching in the present device, and the cascade circuit 20 performs logical operations between the signals HIT and FULL output from the current device and the signals HIT and FULL received from the higher-order device. The results of the logical operations are supplied to the lower-order device.

Finally, signals HIT and FULL indicating the overall search results are output from the lowest-order CAM device.

By using a plurality of CAM devices in the cascaded fashion described above, it becomes possible to efficiently realize a greater number of CAM configurations than can be achieved by a single CAM device, and thus a further reduction in cost can be achieved.

Note that the number of physical banks included in one CAM device may be set to an arbitral value equal to or greater than 2, and the number of logical banks may be set to an arbitrary value equal to or greater than 1. Furthermore, there is no restriction on the number of CAM devices connected in the cascaded fashion. There is no restriction on the bit length of each word and the number of words set in each logical bank or in each physical bank.

In the embodiments described above, the configurations of physical banks are set in terms of the type of CAM (binary or ternary) and the bit length. However, the configuration that can be set in the present invention is not limited to those, but the configuration of each physical bank may also be set in terms of another functional property.

In the embodiments described above, although specific circuit configurations of the CAM array 12, the LP converter 14, the decoder 16, the priority circuit 18, and the cascade circuit 20 are not described, there is no particular restriction on the circuit configurations thereof. Although the LP converter 14 uses the register and the table, the LP converter 14 may be formed in another fashion using another type of circuit.

The present invention can be advantageously applied not only to network devices, but also to various types of systems that need a plurality of CAM devices having different configurations.

Although the content addressable memory according to the present invention has been described above with reference to specific embodiments, the present invention is not limited to the details of those embodiments, but various improvements and modifications are possible without departing from the spirit and the scope of the invention.

The CAM device according to the present invention can be used in various fashions depending on the purpose of usage. Because various configurations can be realized using a single CAM device or a combination of a plurality of CAM devices, a reduction in cost can be achieved. Furthermore, the application of the concept of the logical banks to the CAM device according to the present invention makes it possible for an user to easily control the CAM device without concern for the memory space of the physical banks. Furthermore, searching is performed only in physical banks corresponding to a logical bank to be searched, and thus a reduction in power consumption is achieved.

What is claimed is:

1. A CAM device comprising:
   a CAM array including a plurality of physical banks;
   a logical bank-physical bank converter for setting an assignment between logical banks and physical banks, and for outputting a control signal to set a configuration of one or more physical banks assigned to a logical bank to be searched, depending on a logical bank signal indicating the logical bank to be searched;
   a priority circuit; and
   a cascade circuit,
   wherein in searching one of hit entries and empty entries,
   i) if the CAM device includes one or more physical banks assigned to the logical bank to be searched:
      the logical bank-physical bank converter outputs a search control signal to the one or more physical banks so that each of the one or more physical banks output a search result to the priority circuit; and
      the priority circuit outputs a search result of the CAM device depending on the search result output from each of the one or more physical banks to the cascade circuit; and
   ii) if the CAM device includes no physical bank assigned to the logical bank to be searched;
      the logical bank-physical bank converter outputs a signal directly to the cascade circuit to inform that there is no physical bank assigned to the logical bank so that the cascade circuit generates one of a signal indicating that there is no hit entry in the CAM device and a signal indicating that there is no empty entry in the CAM device as a search result of the CAM device; and
      the cascade circuit performs a logical operation on the search result of the CAM device and a search result supplied from a higher order CAM device, and transmits a result of the logical operation to a lower order CAM device.

2. The CAM device according to claim 1, wherein when the searching is performed, the logical bank-physical bank converter outputs, to each physical bank assigned to the logical bank to be searched, a control signal for dynamically setting the configuration of the physical bank.

3. The CAM device according to claim 1, wherein the logical bank-physical bank converter is capable of assigning one physical bank to two or more different logical banks.

4. The CAM device according to claim 2, wherein the logical bank-physical bank converter is capable of assigning one physical bank to two or more different logical banks.

5. The CAM device according to claim 1, wherein said cascade circuit performs logical OR operation when the cascade circuit generates the signal indicating that there is no hit entry, and performs logical AND operation when the cascade circuit generates the signal indicating that there is no empty entry.

6. The CAM device according to claim 4, wherein said cascade circuit performs logical OR operation when the cascade circuit generates the signal indicating that there is no hit entry, and performs logical AND operation when the cascade circuit generates the signal indicating that there is no empty entry.

* * * * *